United States Patent
Hawe et al.

(10) Patent No.: US 7,170,736 B2
(45) Date of Patent: Jan. 30, 2007

(54) CAPACITOR HAVING LOW RESISTANCE ELECTRODE INCLUDING A THIN SILICON LAYER

(75) Inventors: Francis Edward Hawe, Santa Clara, CA (US); Visith Thipphavong, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/922,435

(22) Filed: Aug. 20, 2004

(65) Prior Publication Data

US 2005/0073801 A1  Apr. 7, 2005

Related U.S. Application Data

(60) Provisional application No. 60/498,513, filed on Aug. 28, 2003.

(51) Int. Cl.
*H01G 4/008* (2006.01)
*H01G 4/06* (2006.01)

(52) U.S. Cl. .................... 361/305; 361/311; 257/303

(58) Field of Classification Search ........ 361/303–305, 361/311, 322; 257/296, 301, 303, 310
See application file for complete search history.

(56) References Cited

U.S. PATENT DOCUMENTS

| | | | |
|---|---|---|---|
| 5,108,941 A | 4/1992 | Paterson et al. | |
| 5,371,039 A | 12/1994 | Oguro | |
| 5,392,189 A * | 2/1995 | Fazan et al. | 361/305 |
| 5,418,180 A * | 5/1995 | Brown | 438/398 |
| 5,508,881 A * | 4/1996 | Stevens | 361/305 |
| 5,573,967 A * | 11/1996 | Tseng | 438/254 |
| 5,691,220 A * | 11/1997 | Ohnishi et al. | 438/253 |
| 5,731,130 A * | 3/1998 | Tseng | 430/316 |
| 5,830,792 A | 11/1998 | Tseng | |
| 5,859,451 A * | 1/1999 | Narita | 257/306 |
| 6,169,010 B1 * | 1/2001 | Higashi | 438/396 |
| 6,255,160 B1 * | 7/2001 | Huang | 438/253 |
| 6,429,069 B1 | 8/2002 | Dennison et al. | |
| 6,440,869 B1 * | 8/2002 | Tseng | 438/734 |
| 6,559,497 B2 | 5/2003 | Shih et al. | |
| 6,756,265 B2 * | 6/2004 | Chen et al. | 438/253 |
| 2002/0125523 A1* | 9/2002 | Oh | 257/310 |
| 2004/0126964 A1* | 7/2004 | Park et al. | 438/253 |
| 2004/0155274 A1* | 8/2004 | DeBoer et al. | 257/296 |

FOREIGN PATENT DOCUMENTS

JP  06029484 A  *  2/1994

* cited by examiner

*Primary Examiner*—Eric W. Thomas
(74) *Attorney, Agent, or Firm*—Lerner, David, Littenberg, Krumholz & Mentlik, LLP

(57) ABSTRACT

A capacitor is provided having a first electrode including a layer of low-resistance non-silicon material. The capacitor includes a layer of silicon formed on the low-resistance material layer and a capacitor dielectric formed on the layer of silicon. A second electrode is formed on the capacitor dielectric, the second electrode including at least a material selected from the group consisting of metals, low-resistance compounds of metals, and deposited semiconductors having a dopant concentration of at least $1 \times 10^{17}$ cm$^{-3}$.

15 Claims, 1 Drawing Sheet

CAPACITOR HAVING LOW RESISTANCE ELECTRODE INCLUDING A THIN SILICON LAYER

CROSS-REFERENCE TO RELATED APPLICATIONS

This application claims the benefit of the filing date of U.S. Provisional Patent Application No. 60/498,513 filed Aug. 28, 2003, the disclosure of which is hereby incorporated herein by reference.

BACKGROUND OF THE INVENTION

The present invention is related to capacitors and more particularly to a structure and method of providing a capacitor having a low resistance electrode including a thin layer of silicon.

The capacitance of a capacitor is determined not only by the materials that make up the capacitor, but also primarily by the thickness of the capacitor dielectric and the dimensions of the capacitor plates according to the equation for an ideal capacitor below:

$$C = kA/d \quad (1)$$

where C is the capacitance, k is the dielectric constant of the capacitor dielectric, A is the area in which the capacitor plates overlie each other, separated by the capacitor dielectric, and d is the thickness of the capacitor dielectric.

It is generally desirable to fabricate a capacitor having a very thin capacitor dielectric in order to maximize the capacitance, since in the equation (1) above, the capacitance varies inversely with the thickness of the capacitor dielectric.

The capacitor's electrical properties also depend to some extent upon the operating environment, that is, the manner in which the capacitor is used. The ranges of frequency, voltage and temperature in which the capacitor is operated all play a role in the way that the capacitor behaves in a circuit.

In order to obtain a capacitor having properties desired for a particular application, fabrication within tolerances for manufacturing, performance and reliability is critical. This is particularly true with respect to capacitors that are utilized in high frequency circuits such as radio frequency (RF) circuits.

Other factors that affect the performance of a capacitor include equivalent series resistance of the capacitor plates and the breakdown strength of the capacitor dielectric. All capacitors exhibit some resistance between their terminals, known as equivalent series resistance (ESR). ESR increases with the switching frequency of the voltage applied to the capacitor. As an example, a capacitor can be connected in a circuit in series with a load resistance to provide a high-pass filtering function. In such case, high equivalent series resistance (ESR) is undesirable, since it causes the signal voltage to be resistively divided relative to the load resistance. In such manner, high ESR can diminish the degree to which signals within the upper frequency passband are distinguished from lower frequency signals below the passband.

The dielectric breakdown strength is a primary measure of both the expected lifetime and reliability of a capacitor, as well as its ability to tolerate voltage spikes and electrostatic discharges which can cause sudden failure of the capacitor.

High capacitance per unit area and high dielectric breakdown strength are in apparent conflict. To increase capacitance per unit area a thinner capacitor dielectric is required, but a thinner capacitor dielectric generally results in lower dielectric breakdown strength.

Conventionally, dielectric films of capacitors are deposited by low temperature processes, i.e., processes conducted at temperatures below about 400 degrees C. For example, chemical vapor deposition (CVD) and plasma enhanced chemical vapor deposition (PECVD) are frequently used to deposit a nitride dielectric film or an oxide dielectric film onto a metal capacitor plate at a temperature below 400 degrees C. Low temperature deposition processes such as CVD and PECVD can be used to deposit a dielectric film on a wide range of capacitor plate materials, including metals such as copper and aluminum. The use of copper and aluminum as capacitor plate materials is desirable because the metals have better conductivity than other metals.

However, the dielectric films that are deposited by low temperature processes tend to have defects, such as pinholes, and include impurities. These defects are brought about by the inclusion of gaseous species in the dielectric film during the deposition. Such defects lower the dielectric breakdown strength of the film, impacting reliability. To compensate for the lowering of the dielectric breakdown strength, the thickness of the capacitor dielectric can be increased. However, this is undesirable, because the capacitance then decreases across the thicker dielectric layer.

Dielectric films which are deposited by processes at high temperatures have properties which are superior to those deposited by low temperature processes. High temperature processes include processes performed at temperatures over about 400 degrees C., such as low-pressure chemical vapor deposition (LPCVD), which is typically performed at temperatures ranging between 700 and 900 degrees C. Such high temperature processes tend to produce more uniform dielectric films which are less prone to the inclusion of pinholes and impurities than low temperature processes, resulting in higher dielectric breakdown strength per unit of thickness than low temperature deposited CVD and PECVD films.

However, the dielectric films that can be deposited by high temperature processes limit the choice of materials for the underlying capacitor plate. Such capacitor plate materials must either not react at all with reagents present in the high temperature process or react only beneficially to them. Moreover, the capacitor plate materials must be able to withstand the high temperatures and subsequent patterning steps of the process. For example, a capacitor plate of tungsten does not serve as a suitable surface on which to deposit a dielectric layer of silicon dioxide or silicon nitride by LPCVD because oxygen ions present in the deposition chamber tend to oxidize the exposed tungsten, severely affecting its conductivity.

In addition, in order for the capacitor to perform well at relatively high frequencies including radio frequencies up to microwave frequencies, the choice of capacitor materials is further limited to the choice of those materials for the capacitor plates and the dielectric film that produce lower thermal losses and/or lower radiative losses than other materials. Thermal and radiative losses can be produced in a capacitor when the energy of AC cycling between voltages is converted to heat and radiation from the capacitor. The selection of low loss materials is desirable in order to maintain the equivalent series resistance of the capacitor within tolerable limits. Certain capacitor dielectrics materials, such as tantalum pentoxide and aluminum oxide, while being attractive because of their very high dielectric constants, nevertheless produce high thermal losses which are manifested as a high equivalent resistance of the capacitor. Other high dielectric constant materials such as ferroelectric dielectric materials, e.g. perovskite materials including but not limited to strontium titanate and barium strontium titanate, cannot be placed in direct contact with certain metals such as copper, aluminum and tungsten, because of harmful interaction that can occur to ultimately destroy the dielectric film.

A particular type of capacitor known as a "metal-oxide-semiconductor" (MOS) capacitor is formed as an element of an integrated circuit chip. The MOS capacitor has one electrode provided by a doped single-crystal semiconductor region of the chip, a capacitor dielectric in contact with the single-crystal semiconductor region and another electrode formed by depositing silicon or a compound of silicon (i.e., a silicide) over the thin dielectric. The thin dielectric typically is formed by thermal oxidation at the surface of the single-crystal semiconductor region.

MOS capacitors typically are utilized to provide large on-chip capacitance, e.g. for decoupling at desired locations within the chip. MOS capacitors are used for on-chip capacitors because they can be made in the chip forming process. However, MOS capacitors are generally undesirable for off-chip applications. In an MOS capacitor, the lower electrode typically is formed in an n+ doped well at the surface of a p-type single-crystal semiconductor substrate. A junction capacitance exists between the n+ well at the surface and lower p-type area of the semiconductor substrate. This junction capacitance, being in series with the capacitance of the MOS capacitor, effectively reduces the capacitance of the capacitor. In addition, processes for making MOS capacitors cannot be optimized for the properties of the capacitor. This is because processes for making MOS capacitors must be integrated into other processes, e.g. implants, gate oxidation and gate conductor fabrication, which are performed concurrently to fabricate transistors on the chip.

A capacitor structure and method of making the same are needed by which one or more of the following properties are obtained: high capacitance per unit area, high dielectric breakdown strength, reduced thermal losses and reduced equivalent resistance.

SUMMARY OF THE INVENTION

According to an aspect of the invention, a capacitor is provided having a first electrode including a layer of low-resistance non-silicon material. The capacitor includes a layer of silicon formed on the layer of low-resistance material and a capacitor dielectric formed on the layer of silicon. A second electrode is formed on the capacitor dielectric, the second electrode including a material selected from the group consisting of metals, low-resistance compounds of metals and deposited semiconductors having a dopant concentration of at least $1 \times 10^{17}$ cm$^{-3}$.

DETAILED DESCRIPTION

The capacitors formed according to the embodiments described herein are capable of being utilized in a variety of ways. For example, such capacitors can be formed as integrated devices on a semiconductor integrated circuit (IC) such as an active IC containing transistors or on a different type of IC known as integrated passives on chip ("IPOC"). As other examples, such capacitors can be fabricated as discrete elements for incorporation in various kinds of chip packages, rigid or flexible circuit panels, lead frames for interconnecting a chip to such types of chip carriers, and the like.

Capacitors described in the embodiments herein typically are intended to operate within certain exemplary ranges of maximum voltages to be applied across the capacitor dielectric. The ranges of maximum voltages are preferably between 0.1 V and 50 V; more preferably between 1 V and 30 V; and most preferably between 1 V and 25 V for off-chip applications in connection with integrated circuits; and most preferably between 0.5 V and 10 V for on-chip applications.

Figure 1:
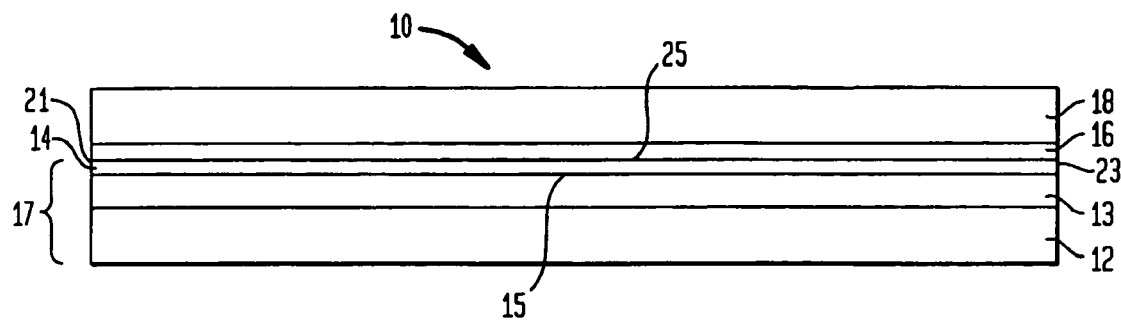
FIG. 1 is a cross-sectional view illustrating a capacitor according to an embodiment of the invention.

FIG. 1 illustrates the structure of a capacitor 10 according to an embodiment of the invention. As shown in FIG. 1, the capacitor 10 includes a bottom layer 12, a low-resistance layer 13 overlying the bottom layer, a silicon layer 14 overlying the low-resistance layer 13, a capacitor dielectric 16 overlying the silicon layer and an upper plate 18 overlying the dielectric 16. The low-resistance layer 13 and silicon layer 14 together constitute a first or lower electrode 17 of the capacitor, whereas the upper plate 18 constitutes the second or upper electrode of the capacitor. As seen in FIG. 1, the silicon layer 14 has a first major surface 15 and a second major surface opposite the first major surface. First and second peripheral edges 21, 23, at opposite ends of the first and second major surfaces extend between the first and second major surfaces. As also seen in FIG. 1, the first major surface of the layer of silicon contacts that low-resistance layer at the first and second peripheral edges and at locations between the first and second peripheral edges. The capacitor may be provided with features (not shown) for connecting each electrode in a larger circuit such as bonding contacts where the capacitor is to be used as a discrete element or conductors extending to other circuit elements where the capacitor is formed as part of an integrated circuit or circuit panel.

The low-resistance layer 13 is preferably formed in contact with the bottom layer 12. The bottom layer 12 can include a conductor, a dielectric, a semiconductor or a combination thereof. The bottom layer may be a dielectric layer of a semiconductor wafer. For example, the bottom layer 12 can be an interlevel dielectric layer formed above a main surface of a single-crystal region of a semiconductor wafer. Where the bottom layer 12 includes a conductor, the conductor will form a portion of the first electrode, along with the low-resistance layer 13 and the silicon layer 14. In a further alternative, low-resistance layer 13 may be a self-supporting element such as a foil, sheet, strip or the like, and the bottom layer 12 may be omitted.

Low-resistance layer 13 includes materials that provide low electrical resistance such as one or more metals and one or more conductive compounds of metals. The material of layer 13 desirably has resistivity less than about 1000 μΩ.cm, more desirably below about 200 μΩ.cm, and preferably less than 50 μΩ.cm. The material of layer 13 is a non-silicon material. As used in this disclosure, the term "non-silicon material" means a material which does not consist essentially of either silicon, a compound of silicon or a combination of silicon and a compound of silicon. The low-resistance material in layer 13 desirably does not react with the silicon layer 14 deposited thereon to a substantial degree to form appreciable amounts of low-conductivity silicide compounds. Layer 13 may include, for example, conductive materials such as titanium nitride (TiN), tantalum nitride (TaN), tungsten nitride (WN) titanium tungsten (Ti—W) and combinations thereof, either as alloys or as composites such as structures including multiple sublayers of differing compositions. In a preferred embodiment, layer 13 includes titanium tungsten (Ti—W). Most preferably, layer 13 consists essentially of titanium tungsten.

Where layer 13 overlies a bottom layer 12, layer 13 most preferably acts as a diffusion barrier between the bottom layer and the silicon layer during fabrication of the capacitor, during use of the capacitor, or both. Where the low-resistance layer acts as a diffusion barrier, it substantially prevents undesirable reactions between the bottom layer and the silicon layer.

Ti—W has resistivity of about 40 μΩ.cm, greater than that of copper, but far less than that of n+ doped silicon, which has resistivity of about 1000 μΩ.cm, even at a heavy dopant concentration of $10^{19}$ cm$^{-3}$. Ti—W is a refractory material, having a melting point ranging in excess of 1600 deg. C., depending upon the relative proportions of Ti and W. Ti—W is deposited by conventional sputtering techniques. Ti—W is less reactive to silicon than tungsten (W) alone but reacts somewhat more readily than TiN, TaN or WN. Under certain conditions, a layer of Ti—W can react with a silicon layer in contact therewith. However, such reaction forms a conductive silicide compound.

The low-resistance layer 13 desirably does not react with the silicon layer 14 to the extent that the reaction substantially modifies a top surface of the silicon layer 14, remote from layer 13. Thus, the top surface of the deposited silicon layer 14 retains desirable properties as a surface on which an LPCVD silicon dioxide or silicon nitride can thereafter be deposited.

A layer of heavily doped silicon 14 is formed by deposition onto the low-resistance layer 13. Silicon has a high melting point in excess of 1200 deg. C. and is deposited by conventional CVD or LPCVD techniques. The dopant concentration is preferably between about $10^{17}$ cm$^{-3}$ and about $10^{20}$ cm$^{-3}$, preferably using an n-type dopant such as arsenic or phosphorous. Alternatively, a p-type dopant such as boron could be used. The layer of silicon 14 can include one deposited layer of polycrystalline silicon ("polysilicon") and/or amorphous silicon. Alternatively, the layer 14 can include a plurality of successively deposited layers of silicon.

The deposited silicon layer 14 desirably is thin, e.g. between 5 nm and 100 nm in thickness, more preferably between 10 and 50 nm, and most preferably between 10 nm and 30 nm in thickness such that it is preferably just thick enough to provide a surface on which the LPCVD silicon dioxide or silicon nitride is deposited. Having a thin silicon layer 14 tends to reduce the resistance.

The combination of the low-resistance layer 13 and the deposited silicon layer 14 make up a lower electrode 17 of the capacitor 10. In order for the electrode 17 to have a desirably low equivalent series resistance (ESR), the low-resistance layer 13 should have a larger proportion of the thickness of the lower electrode 17. By changing the ratio of the thicknesses of the layers 13, 14 the overall resistance of the lower electrode 17 can be adjusted in accordance with circuit requirements.

The deposited silicon layer 14 desirably has a thickness of less than half of the thickness of the lower electrode 13. Preferably, the thickness of the silicon layer 14 is less than half of the thickness of the low-resistance layer 13. Desirably, the silicon layer 14 has a thickness that is just thick enough to reliably support the subsequent deposition of the capacitor dielectric onto it.

It is preferred that the layer of Ti—W 13 remain separate from the layer of silicon 14 after high temperature processing to deposit the capacitor dielectric 16 as discussed below. Preferably, no specific steps are used to cause the silicon of layer 14 to react with the material of the layer 13, so that they remain substantially separate. However, some reaction between silicon layer 14 and the layer 13 may occur during formation of subsequent layers. In this case, it is preferred that the dimensions of and the electrical characteristics of the resultant silicide be repeatable.

An advantage of the use of silicon layer 14 within the capacitor 10 is that it is resistant to chemicals used to etch the subsequently deposited capacitor dielectric. The silicon layer 14 also protects the underlying low-resistance layer 13 from harm during such subsequent processing.

A capacitor dielectric 16, desirably of silicon dioxide or silicon nitride, is formed onto the deposited silicon layer 14 by a high temperature deposition process such as low-pressure chemical vapor deposition (LPCVD). The capacitor dielectric 16 is desirably formed to a thickness ranging between 3 nm and 100 nm, more preferably to a thickness ranging between 3 nm and 50 nm when the capacitor is fabricated as an element of a chip, and most preferably between 5 nm and 30 nm when the capacitor is fabricated as an element of a chip. The capacitor dielectric 16 is desirably formed to a thickness between 20 nm and 100 nm when the capacitor is fabricated as an off-chip element, or for when voltages in excess of 10 V are to be applied to the capacitor 10.

Upper plate 18 is formed in contact with the capacitor dielectric 16. The upper plate desirably includes one or more metals, one or more low-resistance compounds of metals and/or a heavily doped deposited semiconductor, e.g. n+ doped or p+ doped silicon having a dopant concentration ranging between about $10^{17}$ cm$^{-3}$ and $10^{20}$ cm$^{-3}$.

Figure 2:
FIGS. 2 through 4 are cross-sectional views illustrating stages in the fabrication of a capacitor according to an embodiment of the invention.

Referring to FIGS. 1 through 4, a processing method in accordance with an embodiment will now be described. As shown in FIG. 2, in a preferred embodiment, a bottom layer 12 is provided, having a surface 22 on which a low-resistance layer of the capacitor 10 is formed. Bottom layer 12 can include one or more metals, one or more layers of semiconductor material and/or one or more layers of dielectric. Preferably, bottom layer 12 presents an upper dielectric layer as a surface 22 on which the layers of the capacitor 10 are fabricated, beginning with layer 13. Most preferably, bottom layer 12 is a semiconductor substrate having an interlevel dielectric layer at surface 22.

Figure 3:
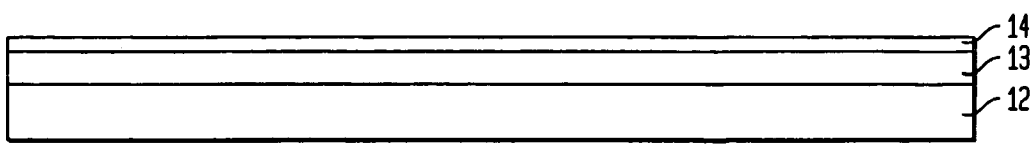
Figure 4:
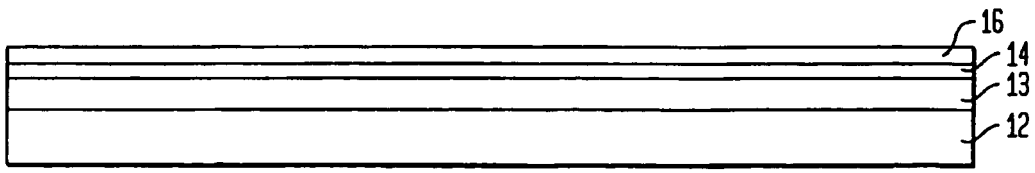

As shown in FIG. 3, low-resistance layer 13 is deposited over the bottom layer 12 as by any one of several conventional techniques including, but not limited to chemical vapor deposition (CVD), and physical vapor deposition (PVD), such as sputtering. The characteristics of the low-resistance layer 13 have been described above. Thereafter, a thin layer 14 of silicon is deposited over layer 13 as a surface upon which the capacitor dielectric layer 16 will be formed. The layer of silicon 14 is preferably deposited onto the exposed layer 13 of the substrate using a first processing chamber of a low pressure chemical vapor deposition (LPCVD) tool designed for silicon deposition.

In a preferred embodiment for depositing silicon layer 14, a thin layer of polysilicon or amorphous silicon is deposited, after which hemispherical grains of amorphous silicon ("hemispherical silicon grains" or "HSG") are deposited. In such way, the surface of the lower capacitor electrode 17 including the silicon layer 14 presents a surface having enhanced surface area. As the name indicates, hemispherical silicon grains have a dome-like surface. Surfaces incorporating HSG can have several times greater surface area than smooth surfaces. In such embodiment, after the HSG are deposited, the capacitor dielectric 16 is deposited by LPCVD deposition in contact with the enhanced surface area silicon layer 14. Because of the increased surface area, a capacitor having a dielectric formed on HSG can provide a capacitance of several times the capacitance of a capacitor having a smooth electrode surface.

However, it is not a requirement that the deposited silicon layer 14 include HSG. There may be reasons why a smooth surface thin silicon layer is desired over and above that of a rough surface silicon layer such as HSG, particularly if high dielectric breakdown strength is the primary goal. The superior uniformity of process and thickness of the capacitor dielectric layer that can be obtained when depositing the capacitor dielectric onto a smooth surface silicon layer tends to provide higher dielectric breakdown strength. The choice of whether to deposit HSG as a component of the silicon layer will depend upon whether higher dielectric breakdown strength or higher capacitance per unit area is desired.

After depositing the silicon layer 14 in one chamber of an LPCVD tool, a subsequent step of depositing a capacitor dielectric 16 of silicon dioxide or silicon nitride can then be performed in another chamber of the same tool. In such manner, the time and handling costs of transporting the substrate from one tool to another can be eliminated.

LPCVD is performed at temperatures above 400 degrees C. that are sufficient to decompose gases that are involved in the reaction. For example, to deposit $SiO_2$, silane ($SiH_4$) and oxygen ($O_2$) are heated to sufficiently high temperatures to decompose the silane ($SiH_4$) into silicon ions ($Si^{+4}$), and hydrogen ions ($H^+$) and to decompose the oxygen ($O_2$) into oxygen ions ($O^=$). Preferred conditions for producing a high quality capacitor dielectric are temperatures between 700 and 900 degrees C. Under such conditions, a dense, quality $SiO_2$ layer 16 is deposited onto the exposed surface of the prior deposited silicon layer 14. Alternatively, a dense high quality silicon nitride layer ($Si_3N_4$) can be deposited as the capacitor dielectric 16. In such case, silane ($SiH_4$) and nitrogen ($N_2$) are supplied to a chamber and the temperature elevated preferably to between 700 degrees C. and 900 degrees C.

The LPCVD deposition of the capacitor dielectric 16 at temperatures between 700 degrees C. and 900 degrees C. is desirably the highest temperature process that is performed in fabricating the capacitor 10. Despite such high temperature processing, the capacitor 10 retains desirable properties because of its structure having only a layer of silicon 14 exposed to reactants when the capacitor dielectric is deposited. The silicon layer 14 protects the low-resistance layer 13 and the bottom layer 12 from damage during that deposition and other subsequent processing in patterning the dielectric 16.

After the capacitor dielectric 16 is deposited, the second, upper electrode 18 is formed. In this step, a greater choice of materials exists since processing can be carried out at lower temperatures than that used to deposit the capacitor dielectric 16. Thus, metals including but not limited to one or more of the following: aluminum, copper, platinum, titanium, tantalum, tungsten, gold, and alloys of such metals can be deposited by various low temperature processing techniques to form the upper capacitor electrode 18. Other choices of materials for the upper electrode include low-resistance compounds of metals and deposited semiconductor materials having a dopant concentration of at least $1\times10^{17}$ $cm^{-3}$.

In forming the upper electrode 18 of a capacitor 10 it may be desirable to deposit a thin heavily doped silicon layer as a first component layer of the upper electrode 18 formed on the capacitor dielectric layer 16. It may be desirable to do so if there is a concern about difference in workfunction across the capacitor dielectric 16. In such case, the silicon layer is provided with a dopant type and concentration matching that of the lower deposited silicon layer 14. As a result, a small or nonexistent workfunction difference can be obtained across the capacitor dielectric 16. By lowering the work function difference, less long-term stressing of the capacitor dielectric 16 is created, thereby increasing the durability and lifetime of the capacitor, particularly if the capacitor is intended for low voltage applications, e.g., at voltages less than about 3 V. Thereafter, a lower resistance material such as a metal or low-resistance compound of a metal is desirably deposited as a second component layer to complete the upper electrode 18. Merely by way of example, the upper electrode 18 may have a structure and composition similar to that of the lower electrode 17.

Subsequent to the formation of a capacitive stack of layers 13, 14, 16 and 18, the layered stack may be patterned by a masked etch to define the dimensions of the final capacitor 10. During such masked etch, it may be desirable to use an etch process having a particular chemistry, for example, HF, when etching the dielectric layer 16, and then use a different process when etching the low-resistance layer 13 below the dielectric layer 16 because the chemistry used to pattern the dielectric 16 would attack the low-resistance layer 13. In such case, the silicon layer 14 provides a layer on which the etch process using the first chemistry can terminate without adversely affecting the low-resistance layer 13, because the silicon layer 14 is resistant to the first chemistry and protectively covers the low-resistance layer 13 at that time.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A capacitor, comprising:
   a first electrode having an electrode thickness, said first electrode including:
   a layer of low-resistance non-silicon material, and
   a layer of silicon having a first major surface contacting said layer of low-resistance material, a substantially smooth second major surface spaced from said first major surface by a thickness of said layer of silicon, and first and second peripheral edges disposed at opposite ends of said first and second major surfaces, said first and second peripheral edges extending between said first and second major surfaces, said first major surface of said layer of silicon contacting said layer of low-resistance non-silicon material at and between locations of said first and second peripheral edges, wherein said thickness of said layer of silicon is less than half said electrode thickness;

a capacitor dielectric disposed on said substantially smooth second major surface of said layer of silicon; and a second electrode formed on said capacitor dielectric, said second electrode including at least one material selected from the group consisting of metals, low-resistance compounds of metals and deposited semiconductors having a dopant concentration of at least $1 \times 10^{17}$ cm$^{-3}$.

2. The capacitor as claimed in claim 1 wherein said thickness of said layer of silicon is between about 5 nm and 100 nm.

3. The capacitor as claimed in claim 2 wherein said thickness of said layer of silicon is between about 5 nm and 50 nm.

4. The capacitor as claimed in claim 3 wherein said thickness of said layer of silicon is between about 10 nm and 30 nm.

5. The capacitor as claimed in claim 1 wherein said low resistance non-silicon material consists essentially of one or more materials selected from the group consisting of refractory metals or conductive alloys of refractory metals.

6. The capacitor as claimed in claim 1 wherein said low-resistance non-silicon material consists essentially of one or more materials selected from the group consisting of titanium tungsten (Ti—W), tantalum nitride (TaN), titanium nitride (TiN), and tungsten nitride (WN).

7. The capacitor as claimed in claim 1 wherein said layer of silicon includes at least one material selected from the group consisting of amorphous silicon and polycrystalline silicon (polysilicon).

8. The capacitor as claimed in claim 1 wherein said capacitor dielectric includes silicon dioxide.

9. The capacitor as claimed in claim 1 wherein said layer of silicon includes a dopant selected from the group consisting of boron, phosphorous, and arsenic, said dopant having a concentration of at least $1 \times 10^{17}$ cm$^{-3}$ in said layer of silicon.

10. A capacitor as claimed in claim 1 further comprising a bottom layer disposed beneath said layer of low resistance material, said layer of low resistance material forming a diffusion barrier between said bottom layer and said layer of silicon.

11. The capacitor as claimed in claim 1, wherein said capacitor dielectric is substantially free of pinhole defects.

12. The capacitor as claimed in claim 1, wherein said capacitor dielectric contacts said entire second surface of said layer of silicon.

13. A capacitor, comprising:

a first electrode having an electrode thickness, said first electrode including:

a layer of low-resistance non-silicon material, and a first layer of silicon having a first major surface contacting said layer of low-resistance material, a second major surface opposite said first major surface, and first and second peripheral edges disposed at opposite ends of said first and second major surfaces, said first and second peripheral edges extending between said first and second major surfaces, said first major surface of said first layer of silicon contacting said layer of low-resistance non-silicon material at and between locations of said first and second peripheral edges, wherein said thickness of said layer of silicon is less than half said electrode thickness;

a capacitor dielectric disposed on said first layer of silicon; and a second electrode disposed on said capacitor dielectric, said second electrode including a second layer of silicon having an inner surface contacting said capacitor dielectric and an outer surface opposite said inner surface, said second electrode further including a conductive layer including at least one conductive material selected from the group consisting of metals and conductive compounds of metals disposed on said outer surface, said conductive layer spaced from said capacitor dielectric by said second layer of silicon.

14. The capacitor as claimed in claim 13, wherein said first layer of silicon includes hemispherical silicon grains.

15. A capacitor, comprising:

a first electrode having an electrode thickness, said first electrode including:

a layer of low-resistance non-silicon material;

a layer of silicon having a first major surface, a second major surface opposite said first major surface, and first and second peripheral edges disposed at opposite ends of said first and second major surfaces, said first and second peripheral edges extending between said first and second major surfaces, said first major surface of said layer of silicon contacting said layer of low-resistance non-silicon material at and between locations of said first and second peripheral edges, wherein said thickness of said layer of silicon is less than half said electrode thickness;

a capacitor dielectric disposed on said layer of silicon, said capacitor dielectric having a thickness between about 5 nanometers (nm) and 30 nm, being formed by a process including low pressure chemical vapor deposition and having superior dielectric breakdown strength; and a second electrode disposed on said capacitor dielectric, said second electrode including at least one material selected from the group consisting of metals, low-resistance compounds of metals and deposited semiconductors having a dopant concentration of at least $1 \times 10^{17}$ cm$^{-3}$.

\* \* \* \* \*

UNITED STATES PATENT AND TRADEMARK OFFICE
CERTIFICATE OF CORRECTION

| | | |
|---|---|---|
| PATENT NO. | : 7,170,736 B2 | Page 1 of 1 |
| APPLICATION NO. | : 10/922435 | |
| DATED | : January 30, 2007 | |
| INVENTOR(S) | : Francis Edward Hawe and Visith Thipphavong | |

It is certified that error appears in the above-identified patent and that said Letters Patent is hereby corrected as shown below:

Column 9, line 18, delete "3" and insert therefor --2--.
Column 9, line 42, "low resistance" should read --low-resistance--.

Signed and Sealed this

Twenty-seventh Day of November, 2007

JON W. DUDAS
*Director of the United States Patent and Trademark Office*